(12) United States Patent
Allen (10) Patent No.: US 7,421,924 B1
(45) Date of Patent: Sep. 9, 2008

(54) APPARATUS FOR RAISING OR TILTING A MICROMECHANICAL STRUCTURE

(75) Inventor: James J. Allen, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 616 days.

(21) Appl. No.: 11/201,457

(22) Filed: Aug. 11, 2005

(51) Int. Cl.
*G05G 11/00* (2006.01)
*H02N 1/00* (2006.01)
*G02B 7/182* (2006.01)
*G02B 6/26* (2006.01)

(52) U.S. Cl. .................. 74/479.01; 74/490.09; 310/309; 359/872; 385/18

(58) Field of Classification Search .............. 74/479.01, 74/490.09; 310/309; 359/872; 385/18
See application file for complete search history.

(56) References Cited

U.S. PATENT DOCUMENTS

| | | | |
|---|---|---|---|
| 5,867,297 A * | 2/1999 | Kiang et al. ................ | 359/198 |
| 5,994,159 A * | 11/1999 | Aksyuk et al. ............... | 438/52 |
| 6,133,670 A | 10/2000 | Rodgers et al. | |
| 6,300,156 B1 | 10/2001 | Decker et al. | |
| 6,507,138 B1 | 1/2003 | Rodgers et al. | |
| 6,543,087 B2 | 4/2003 | Yeh et al. | |
| 6,675,671 B1 | 1/2004 | Jokiel, Jr. et al. | |
| 6,728,017 B2 * | 4/2004 | Park ........................ | 359/224 |
| 6,734,597 B1 | 5/2004 | Howell et al. | |
| 6,745,567 B1 | 6/2004 | Mercanzini | |
| 6,903,861 B1 * | 6/2005 | Allen ....................... | 359/291 |
| 2001/0053261 A1 * | 12/2001 | Goldstein et al. ............ | 385/18 |
| 2003/0053743 A1 * | 3/2003 | Liu et al. .................... | 385/18 |

* cited by examiner

*Primary Examiner*—David N Spector
(74) *Attorney, Agent, or Firm*—John P. Hohimer (57) ABSTRACT

An active hinge apparatus is disclosed which can be used to raise a micromechanical structure (e.g. a plate or micromirror) on a substrate. The active hinge apparatus utilizes one or more of teeth protruding outward from an axle which also supports the micromechanical structure on one end thereof. A rack is used to engage the teeth and rotate the axle to raise the micromechanical structure and tilt the structure at an angle to the substrate. Motion of the rack is provided by an actuator which can be a mechanically-powered actuator, or alternately an electrostatic comb actuator or a thermal actuator. A latch can be optionally provided in the active hinge apparatus to lock the micromechanical structure in an "erected" position.

21 Claims, 11 Drawing Sheets

APPARATUS FOR RAISING OR TILTING A MICROMECHANICAL STRUCTURE

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to micromechanical and microelectromechanical devices, and in particular to an active hinge apparatus for raising or tilting a micromechanical structure such as a tiltable plate or micromirror.

BACKGROUND OF THE INVENTION

Micromechanical hinged elements have been used to form many different types of micromechanical and microelectromechanical devices (see e.g. U.S. Pat. Nos. 6,300,156; 6,543,087; 6,903,861; and 6,675,671 which are incorporated herein by reference). Many different approaches have been used to unfold micromechanical hinged elements which can have lateral dimensions of up to a few millimeters. These approaches include using forces due to gravity, surface tension or magnetism to erect a plurality of three-dimensional structures which are generally batch-fabricated on a common substrate. Additionally, mechanical forces provided by a micromanipulator probe can be used to contact and erect each micromechanical structure one at a time, but this individualized assembly approach is generally not preferred for volume production.

What is needed for many applications is a way of precisely raising a micromechanical structure to an arbitrary angle with respect to a supporting substrate.

The present invention provides a solution to this problem by providing an active hinge apparatus which can be operated using an actuator provided on the substrate.

The active hinge apparatus of the present invention is relatively compact and can be fabricated by conventional surface micromachining.

The active hinge apparatus of the present invention can be connected to a plate, micromirror or any other type of micromechanical structure to be raised above a substrate, with the active hinge apparatus being operated by an electrostatic actuator, a thermal actuator, or a manually-operated actuator connected thereto.

These and other advantages of the present invention will become evident to those skilled in the art.

SUMMARY OF THE INVENTION

The present invention relates to an apparatus (also referred to herein as an active hinge apparatus) for raising a micromechanical structure (e.g. a plate or micromirror) from a first position substantially parallel to a substrate whereon the micromechanical structure is formed to a second position which is at an angle to the substrate. The apparatus comprises an axle supported on the substrate and attached to one end of the micromechanical structure, with the axle having a pair of teeth protruding outward therefrom, with the teeth being oriented substantially perpendicular to each other and to an axis of rotation of the axle; a rack above the axle to engage the pair of teeth and rotate the axle upon movement of the rack in a direction substantially parallel to the substrate, thereby raising the micromechanical structure from the first position to the second position; and an actuator located on the substrate and operatively connected to move the rack.

The actuator can comprise a mechanically-powered actuator which includes a moveable frame which is sized to receive a probe tip, and which is operatively connected to the rack. Alternately, the actuator can comprise an electrostatic comb actuator or a thermal actuator.

The substrate can comprise silicon. The axle and the pair of teeth can comprise polycrystalline silicon. A pair of guides can be formed on opposite sides of the rack to guide the movement of the rack. Additionally, an optional latch can be provided on the substrate to lock the micromechanical structure in the second position, which can be, for example, an angle of 90 degrees with respect to the substrate.

The present invention further relates to a micromechanical apparatus which comprises a substrate; a plate supported on the substrate by an axle located at one end of the plate, with the axle having a first set of teeth which are substantially perpendicular to the plate, and with the axle having a second set of teeth which are substantially parallel to the plate; and a rack located above the axle to engage at least one of the first and second sets of teeth and thereby rotate the axle and tilt the plate at an angle to the substrate when the rack is moved in a direction substantially parallel to the substrate. The plate can include a mirror coating, thereby forming a tiltable micromirror. The apparatus can further include an actuator located on the substrate, with the actuator being operatively connected to move the rack and thereby tilt the plate. The actuator can comprise a mechanically-powered actuator having a moveable frame which is sized to receive a probe tip, with the moveable frame being operatively connected to the rack. Alternately, the actuator can comprise an electrostatic comb actuator or a thermal actuator. Additionally, a latch can be provided on the substrate to lock the plate in a tilted position (e.g. 90°) with respect to the substrate.

The substrate can comprise silicon. The plate can comprise polycrystalline silicon. A pair of guides can also be formed on opposite sides of the rack to guide the movement of the rack.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
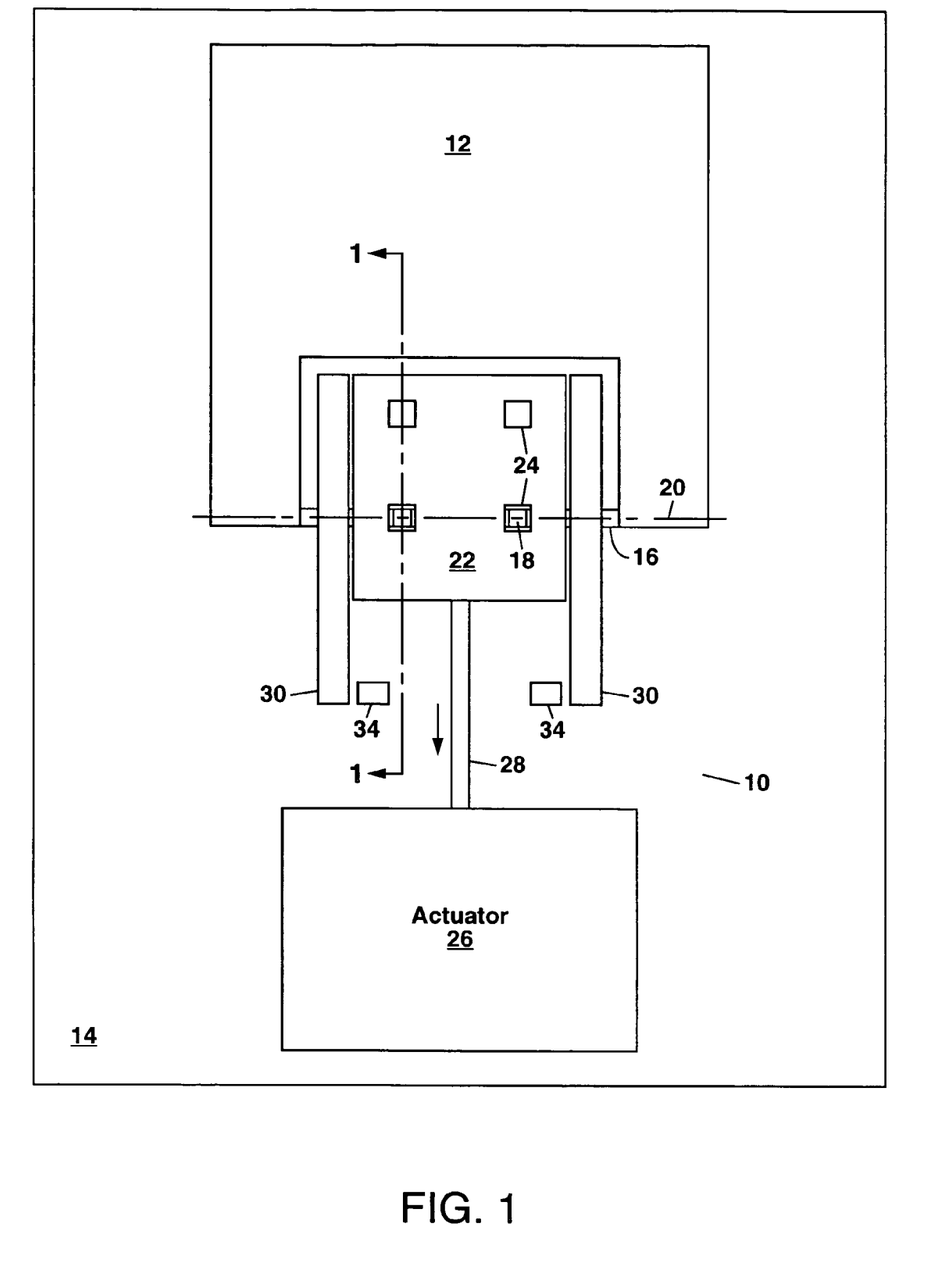
FIG. 1 shows a schematic plan view of a first example of the active hinge apparatus of the present invention.

Referring to FIG. 1, there is shown a schematic plan view of a first example of the active hinge apparatus 10 of the present invention. The active hinge apparatus 10 can be used to raise various types of micromechanical structures 12 including a plate 12 which is shown in the example of FIG. 1. The active hinge apparatus 10 and the plate 12 can be formed on a common substrate 14 using surface micromachining.

In the example of FIG. 1, the active hinge apparatus 10 comprises an axle 16 which is rotatably supported on the substrate 14, with the axle 16 being attached at both ends thereof to the plate 12. The axle 16 has a pair of teeth 18 protruding outward from the axle 16 at one or more points along the length of the axle 16. These teeth 18 in each pair are oriented substantially perpendicular to each other and to an axis of rotation 20 of the axle 16. The teeth 18 in the example of FIG. 1 can also be viewed as being arranged in two sets, with a first set of the teeth 18 being substantially perpendicular to the plate 12, and with a second set of the teeth 18 being substantially parallel to the plate 12. The teeth 18 act much like gear teeth to mesh with a rack 22 located above the axle 16 so that movement of the rack 22 in a direction substantially parallel to the substrate 14 produces a rotation of the axle 16 over an angle of up to 90° thereby tilting the plate 12 above the substrate 14. The teeth 18 and rack 22 are initially fabricated so that the rack 22 engages the teeth 18 (i.e. the first set of teeth) which are initially substantially perpendicular to the axis of rotation 20 of the axle 16 as shown in FIG. 1. In this "as-fabricated" position, the first set of teeth are located within openings 24 through the rack 22 (see FIG. 1).

The active hinge apparatus 10 further includes an actuator 26 which is operatively connected to the rack 22. This connection of the actuator 26 to the rack 22 can be made, for example, using a linkage 28. The actuator 26 is used to move the rack 22 in a direction substantially parallel to the substrate 14 as indicated by the arrow in FIG. 1. When this is done, the rack 22 pulls against the first set of teeth 18 thereby rotating the axle 16 and tilting the plate 12 upward away from the substrate 14. Movement provided by the actuator 26 in the direction shown by the arrow in FIG. 1 serves to raise the micromechanical structure 12; whereas motion in an opposite direction can be used to lower a previously-raised structure 12.

A pair of guides 30 can be provided on either side of the rack 22 to guide the motion of the rack 22. These guides 30 can also be used to rotatably support the axle, which can pass through an opening 32 in the guides 30 (see FIG. 2A). Additionally, one or more stops 34 can be provided on the substrate 14 to limit further movement of the rack 22 beyond a certain point (e.g. when the plate 12 is raised to be substantially perpendicular to the substrate 14).

It should be noted that the axle 16 generally has a square or rectangular cross-section shape due to fabrication constraints associated with surface micromachining, and the openings 32 are also generally square or rectangular for the same reason. As a result, the openings 32 are generally sized larger than the axle 16 (e.g. by about 1-2 µm on each side when the axle has cross-sectional dimensions of about 2 µm).

Figure 2A:
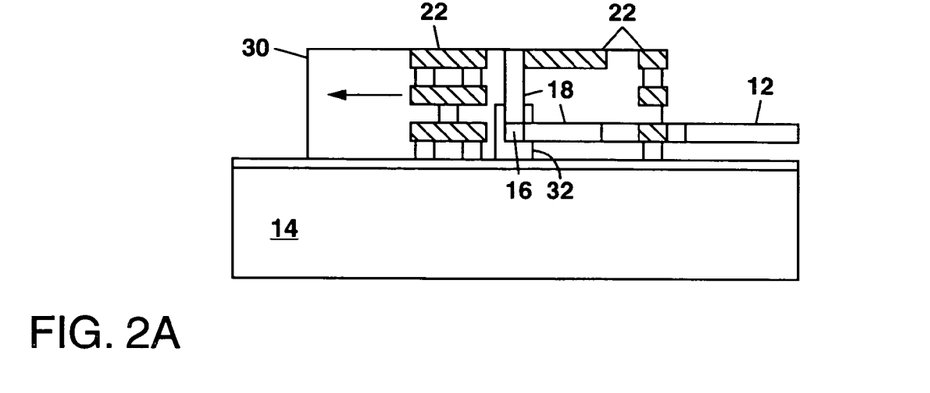
FIGS. 2A-2D show schematic cross-section views of the device of FIG. 1 to illustrate how the rack engages the teeth on the axle to raise a micromechanical structure (e.g. a plate or micromirror) connected to the axle.
Figure 2B:
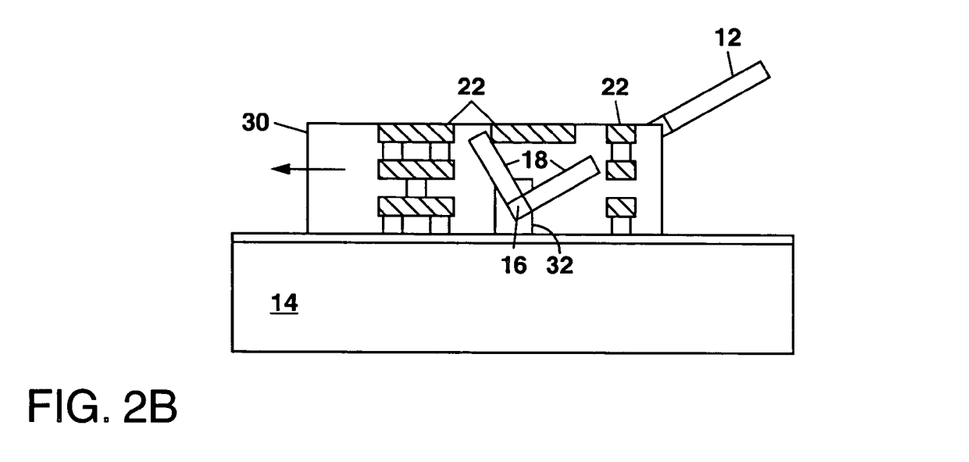

Operation of the active hinge apparatus 10 can be further understood with reference to FIGS. 2A-2D which show schematic cross-section views along the section line 1-1 in FIG. 1. In FIG. 2A, as the rack 22 begins to move in the direction shown by the arrow in response to activation of the actuator 26, the rack 22 initially contacts the first set of teeth 18 which extend upward substantially perpendicular to the substrate 14 into openings 24 in the rack 22, and begins to pull against this first set of teeth 18, thereby rotating the axle 16 in a counter-clockwise direction. This begins to uplift the plate 12, which is connected to the axle 16, as shown in FIG. 2B. The second set of teeth 18 are also uplifted since these teeth 18 are formed from a same layer of polycrystalline silicon (also termed polysilicon) as the plate 12.

Figure 2C:
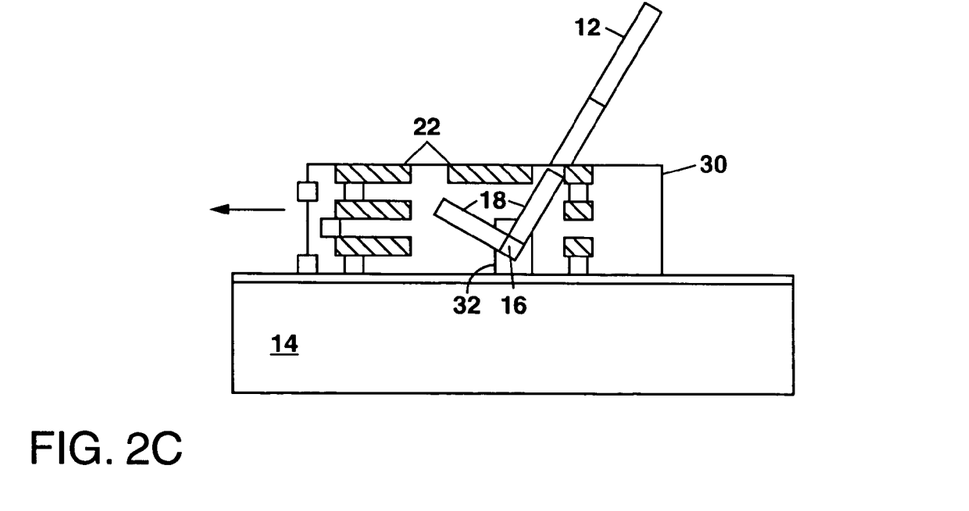
Figure 2D:
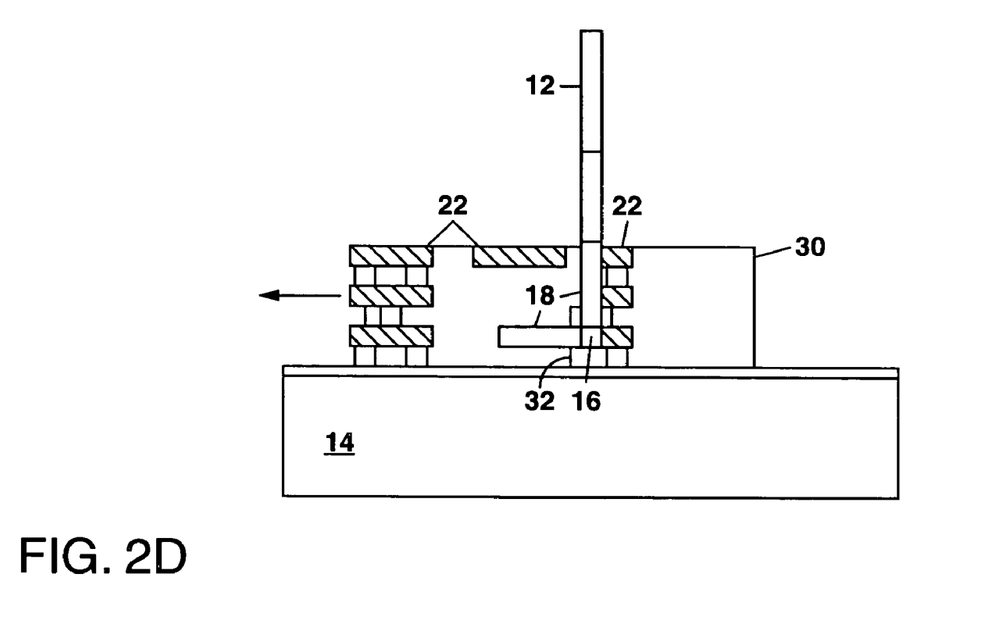

In FIG. 2C, further movement of the rack 22 produces a further upward tilting of the plate 12. Additionally, the second set of teeth 18, which was initially parallel to the substrate 14 in FIG. 2A, is rotated sufficiently to engage with the rack 22 as shown in FIG. 2C. As the rack 22 continues to move in the direction of the arrow in FIG. 2D, the second set of teeth 18 rotates the plate 12 to a position which is substantially perpendicular to the substrate 14. Those skilled in the art will understand that movement of the rack 22 can be stopped at any point so that the plate 12 can be tilted to an arbitrary angle between 0° (i.e. parallel to the substrate 14) and 90° (i.e. perpendicular to the substrate 14). The exact movement of the rack 22 to raise the plate 12 perpendicular to the substrate 14 will depend upon the length of the teeth 18, and can be, for example, 17 µm when the teeth have a length of 10 µm.

It should also be noted that the first and second sets of teeth 18 need not have the same length. The length of the first set of teeth 18 is determined by the thickness of the various material layers used to build up the structure of the active hinge apparatus 10, while the length of the second set of teeth 18 can be selected to facilitate engagement with the rack 22. As an example, the length of the first set of teeth 18 can be 8.5 µm; and the length of the second set of teeth 18 can be 10 µm. Additionally, the openings 24 in the rack 22 that engage with the first and second sets of teeth 18 need not be sized the same.

In the example of FIG. 1, the actuator 26 can be either electrically powered or mechanically powered. Examples of electrically-powered actuators 26 include electrostatic comb actuators and thermal actuators which can be fabricated on the substrate 14 using the same polysilicon layers used to build up the active hinge apparatus 10. Electrostatic comb actuators and thermal actuators formed by surface micromachining are well known in the art and need not be described in great detail herein.

Figure 3:
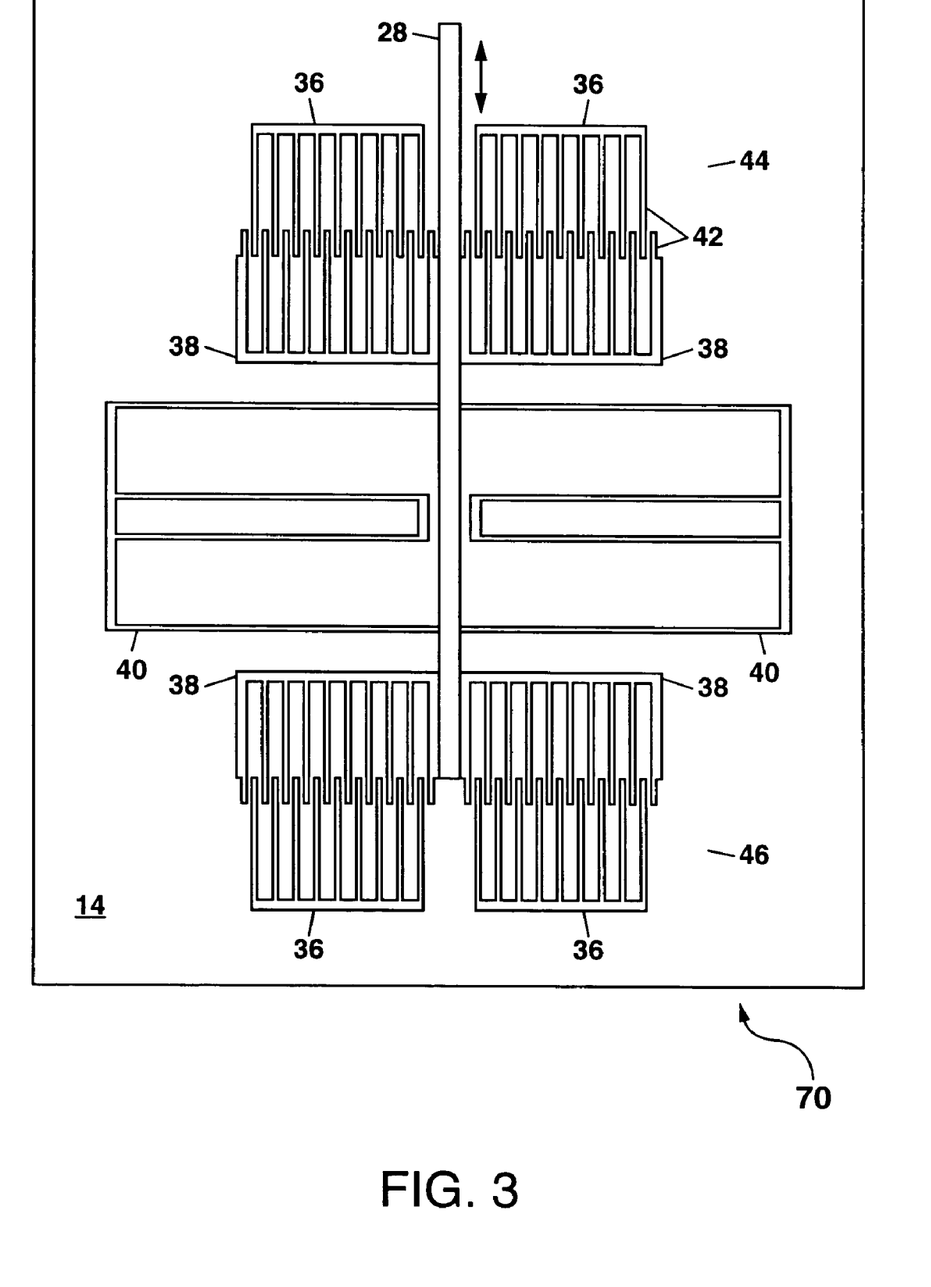
FIG. 3 shows a schematic plan view of an example of an electrostatic comb actuator which can be used in the active hinge apparatus of FIG. 1.
Figure 4:
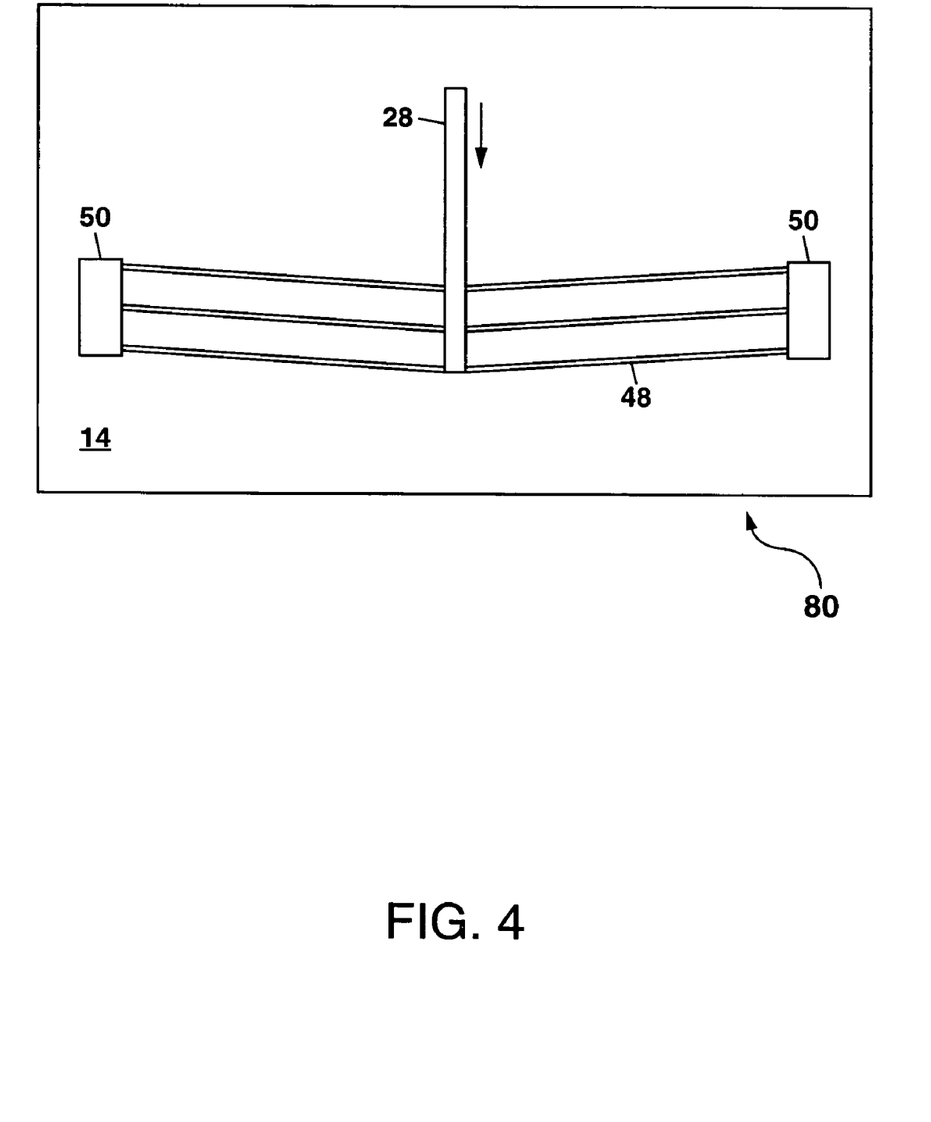
FIG. 4 shows a schematic plan view of a thermal actuator which can be used in the active hinge apparatus of FIG. 1.

An electrostatic comb actuator 70 as schematically illustrated in plan view in FIG. 3 comprises one or more stationary electrostatic combs 36 supported on the substrate 14, and one or more moveable electrostatic combs 38 which are suspended above the substrate 14 by a plurality of springs 40 (e.g. folded springs). Each stationary electrostatic comb 36 is generally electrically insulated from the substrate 14; and each moveable electrostatic comb 38 is generally held at ground electrical potential. Each comb 36 and 38 comprises a plurality of fingers 42 which are interdigitated as shown in FIG. 4 so that each moveable electrostatic comb 38 is partially enmeshed with one of the stationary electrostatic combs 36.

In the example of FIG. 3, the electrostatic comb actuator 70 can operate bidirectionally to provide a forward and backward movement as shown by the double-sided arrow. This is possible because the stationary and moveable electrostatic combs 36 and 38 can be arranged in sets of oppositely oriented combs. A first set 44 of the combs 36 and 38 is oriented so that an electrostatic force of attraction moves the stationary and electrostatic combs 36 and 38 in the first set 44 together to move the linkage 28 upward in FIG. 3 when a voltage form an external source (not shown) is applied between the combs 36 and 38 of the first set 44. A second set 46 of the combs 36 and 38 is arranged oppositely to move the linkage 28 downwards when the second set 46 of combs 36 and 38 is activated by the applied voltage. The exact displacement provided by each set 44 and 46 of combs will depend upon the magnitude of the applied voltage. The forward and backward movement provided by the electrostatic comb actuator 70 allows the micromechanical structure 12 to be raised and lowered as needed.

Each electrostatic comb 36 and 38 and the springs 40 can be fabricated from a plurality of stacked and interconnected layers of polysilicon during fabrication of the remainder of the active hinge apparatus 10 as will be described hereinafter. Electrical wiring to the electrostatic combs 36 and 38 can be provided on the substrate 14 using a patterned layer of polysilicon (e.g. a Poly-0 layer).

Further details of electrostatic comb actuators can be found in U.S. Pat. Nos. 6,507,138; 6,133,670 and 6,903,861 which are incorporated herein by reference.

FIG. 4 shows a schematic plan view of a thermal actuator 80 which can be used for the actuator 26 in FIG. 1. The thermal actuator 80 in FIG. 4 comprises one or more beams 48 which are suspended above the substrate 14 between anchors 50 to provide an overall bent shape. The term "bent shape" as used herein refers to a shape which deviates from a straight line, and is intended to include a curvilinear or bowed shape. Such an overall bent shape can be formed from a plurality of straight beam segments which are directly or indirectly connected together end to end.

In the example of FIG. 4, the anchors 50 can be electrically conductive and can be electrically insulated from the substrate 14 (e.g. by underlying layers of silicon nitride and a thermal oxide). The beams 48 are also electrically conductive (e.g. comprising doped polysilicon).

An electrical current can be conducted through the beams 48 by applying a voltage from an external source (not shown) between the anchors 50 which can form contact pads. The electrical current heats the beams 48 thereby expanding the beams 48 longitudinally. This further bends the beams 48 and moves the linkage 28 in the direction shown by the arrow in FIG. 4. The displacement of the linkage 28 shown by the arrow in FIG. 4 can be magnified by up to ten times or more compared to the longitudinal expansion of the beams 48, with the exact displacement depending upon the electrical current flowing through the beams 48. Upon reducing the electrical current, the beams 48 will cool and move the linkage 28 in a direction opposite that shown by the arrow.

Each beam 48 in the thermal actuator 80 of FIG. 4 can be up to a few microns wide, with a height of up to about 10 μm, and with a length up to about one millimeter. Multiple beams 48 can be ganged together as needed to provide sufficient force to operate the active hinge apparatus 10 of the present invention.

Further details of thermal actuators suitable for use with the active hinge apparatus 10 of the present invention can be found in U.S. Pat. No. 6,734,597 which is incorporated herein by reference.

A mechanically-powered actuator 90 can also be used with the active hinge apparatus 10 of the present invention. Such a mechanically-powered actuator 90 can comprise a moveable frame 52 as shown in a second example of the present invention in FIG. 6. The moveable frame 52 can be contacted by a external micromanipulator probe tip 100 and urged to move in the direction shown by the arrow in FIG. 6. Movement of the frame 52 then imparts movement to each rack 22, which is operatively connected to the frame 52 by the linkage 28. As the rack 22 moves, this rotates the axle 16 and raises the micromechanical structure 12 which is connected to the axle 16.

Returning to the example of FIG. 1, fabrication of the active hinge apparatus 10 by surface micromachining will now be described with reference to FIGS. 5A-5H which are schematic cross-section views along the section line 1-1 in FIG. 1. Surface micromachining utilizes conventional semiconductor integrated circuit (IC) processes to deposit and pattern a plurality of layers of polysilicon and a sacrificial material (generally silicon dioxide or a silicate glass such as TEOS). The various polysilicon layers can be used to form the structure of the active hinge apparatus 10 including the actuator 26, and also to form the micromechanical structure 12. The sacrificial material is used during a build-up of the active hinge apparatus 10 and the micromechanical structure 12 and then is removed to free up these devices for movement.

The term "patterning" as used herein refers to a sequence of well-known semiconductor integrated circuit processing steps including applying a photoresist to the substrate 14, prebaking the photoresist, aligning the substrate 14 with a photomask, exposing the photoresist through the photomask, developing the photoresist, baking the photoresist, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial material layer in preparation for defining features into the layer by anisotropic dry etching (e.g. reactive ion etching). The term "micromechanical structure" as used herein is also intended to included microelectromechanical structures (i.e. micromechanical structures which include electrical functionality).

The substrate 14, which generally comprises silicon, can be initially prepared for fabrication of the active hinge apparatus 10 and other elements to be formed on the substrate 14. This can be done by blanket depositing layers of a thermal oxide and silicon nitride over the substrate 14. These layers have been omitted from FIGS. 2A-2D and FIGS. 5A-5H for clarity. The thermal oxide layer can be about 0.6 μm thick and can be deposited using a conventional wet oxidation process at an elevated temperature (e.g 1050° C. for about 1.5 hours). The silicon nitride layer can comprise 0.8 μm of low-stress silicon nitride deposited over the thermal oxide layer using low-pressure chemical vapor deposition (LPCVD) at about 850° C. The thermal oxide and silicon nitride layers provide electrical isolation from the substrate 14 for subsequently-deposited polysilicon layers.

Figure 5A:
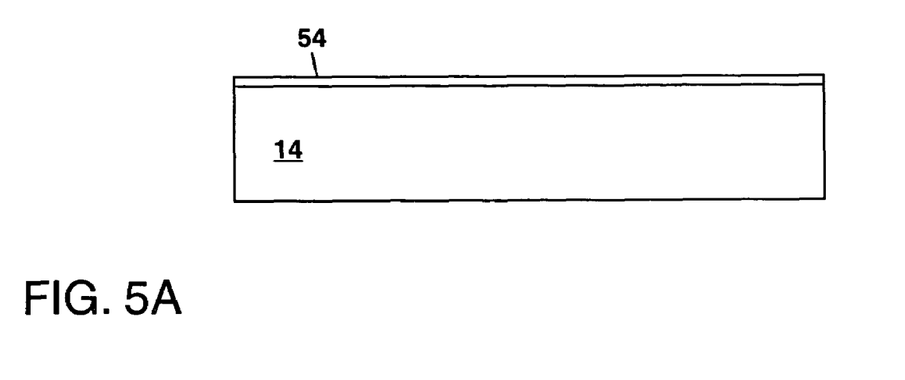
FIGS. 5A-5H show schematic cross-section views along the section line 1-1 in FIG. 1 to illustrate a series of process steps for fabricating the device of FIG. 1.

In FIG. 5A, a first polysilicon layer 54 (termed Poly-0) is blanket deposited over the substrate 14 by LPCVD at a temperature of about 580° C. using phosphorous or boron as an impurity dopant to provide electrical conductivity. All subsequent polysilicon layers can be deposited by LPCVD at this same temperature, and can be doped as needed for electrical conductivity. The Poly-0 layer 54, which can be 0.3 μm thick, is used to form a base (e.g. a ground plane) beneath the active hinge apparatus 10 (see FIGS. 7 and 8) and also to form any electrical wiring needed on the substrate 14 (e.g. to provide electrical connections to an electrostatic actuator 70 or a thermal actuator 80, or to provide any electrical connections needed for the micromachined structure 12). One or more vias (not shown) can be formed through the underlying thermal oxide and silicon nitride layers so that the Poly-0 layer 54 can be electrically connected to the substrate 14 as needed, with the substrate 14 generally being held at ground electrical potential.

Figure 5B:
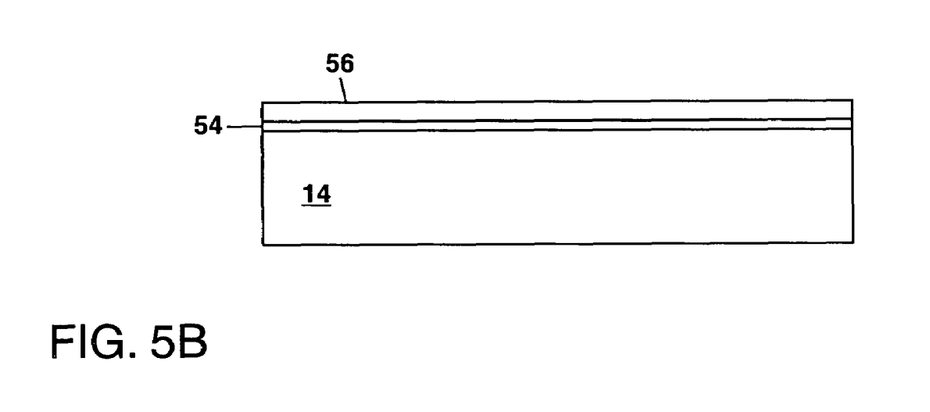

In FIG. 5B, a first layer of a sacrificial material 56 about 2 µm thick can be blanket deposited over the substrate 14 and patterned. After deposition of the sacrificial material 56 and prior to patterning thereof, an annealing step can be performed at an elevated temperature (e.g. 1100° C. for three hours) to anneal out any stress in the underlying Poly-0 layer 54. Each additional polysilicon layer can also be similarly annealed to remove a residual stress therein after encapsulating the polysilicon layer beneath a layer of the sacrificial material 56.

A plurality of openings (not shown) can be etched through the sacrificial material 56 at locations where a subsequently-deposited polysilicon layer 58 (termed Poly-1) is to be connected to the underlying Poly-0 layer 54 to build up elements of the active hinge apparatus 10 including the guides 30 and stops 34. If needed, other openings can be etched partway through the sacrificial material 56 so that the patterned sacrificial material 56 can be used as a mold to define features in the subsequently-deposited Poly-1 layer 58. The sacrificial material can comprise silicon dioxide or a silicate glass (e.g. TEOS) deposited by chemical vapor deposition (CVD) to a layer thickness of, for example, 2 µm.

Figure 5C:
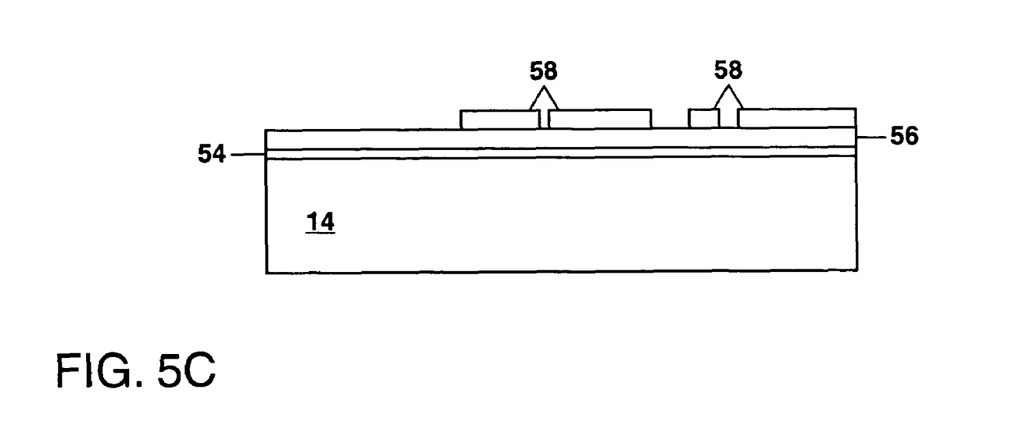

In FIG. 5C, the Poly-1 layer 58 can be blanket deposited over the substrate 14 to a layer thickness of, for example, 2.5 µm. This can be done in a single deposition step or alternately in a plurality of deposition steps. The Poly-1 layer 58 is used to begin to build up certain elements of the apparatus 10 including the rack 22 and linkage 28; to further build up other elements of the apparatus 10 including the guides 30 and stops 34; and to form yet other elements of the apparatus 10 including the axle 16 and the second set of teeth 18.

Figure 5D:
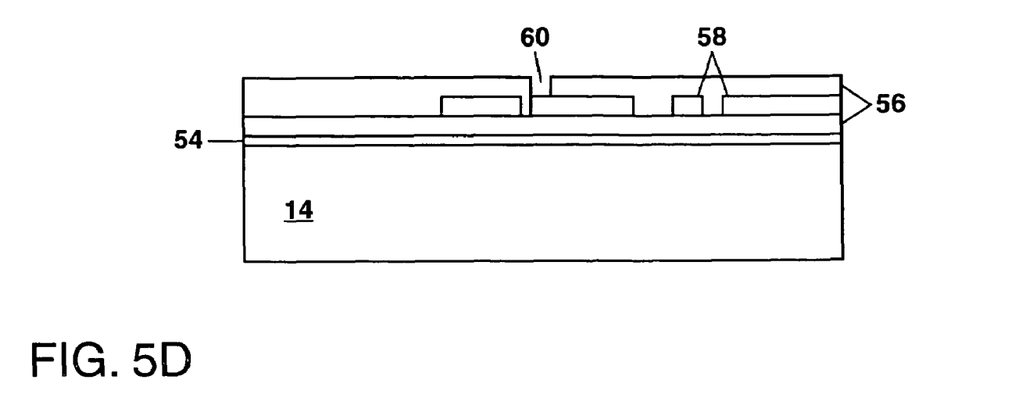

In FIG. 5D, another layer of the sacrificial material 56 can be blanket deposited over the substrate 14 and planarized by chemical-mechanical polishing to provide a layer thickness of, for example, 2 µm above the Poly-1 layer. After annealing the underlying Poly-1 layer 58 as previously described, an opening 60 can be formed through the sacrificial material 56 at a location where the second set of teeth 18 will be built up from a subsequently-deposited polysilicon layer 62 (termed Poly-2) and at other locations where the Poly-2 layer will be connected to the underlying Poly-1 layer 58 (e.g. for the rack 22, guides 30, stops 34, etc.).

Figure 5E:
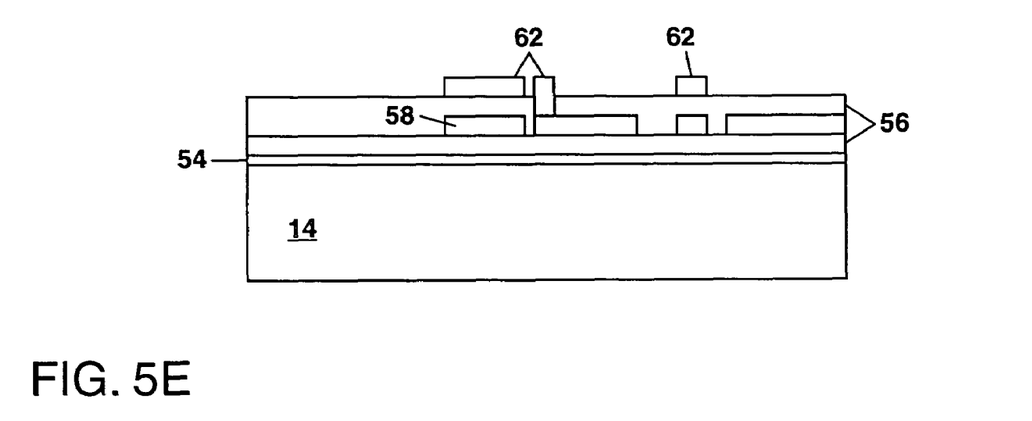

In FIG. 5E, the Poly-2 layer 62 can be blanket deposited over the substrate 14 to a layer thickness of, for example, 2.25 µm and patterned to begin to form the second set of teeth 18 and other elements of the active hinge apparatus 10 including the rack 22, guides 30, stops 34, linkage 28, etc. The Poly-2 layer can also be used to further build-up the micromechanical structure 12 when this element comprises more than a single polysilicon layer.

Figure 5F:
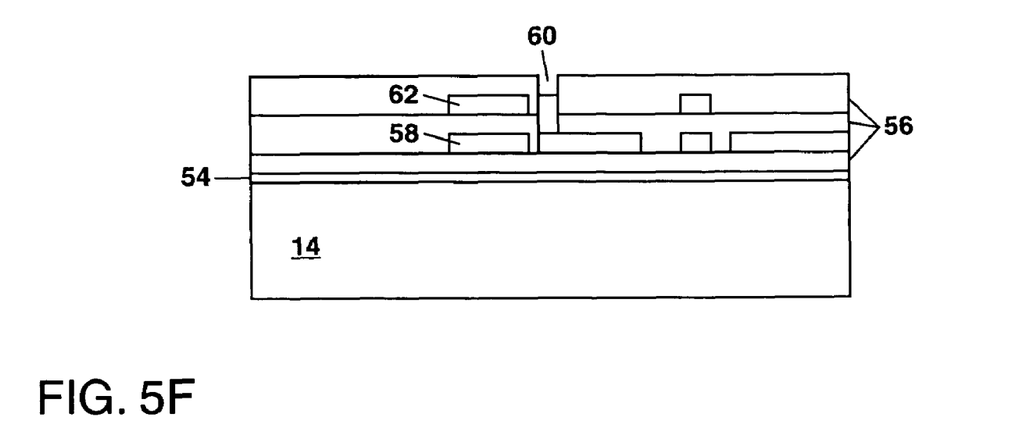

In FIG. 5F, yet another layer of the sacrificial material 56 can be deposited over the substrate 14 and planarized to provide a layer thickness of, for example, 2 µm above the Poly-2 layer. After annealing the underlying Poly-2 layer 62, openings 60 can be formed through this layer of the sacrificial material 56 in preparation for further building up the second set of teeth 18 and other elements of the active hinge apparatus 10.

Figure 5G:
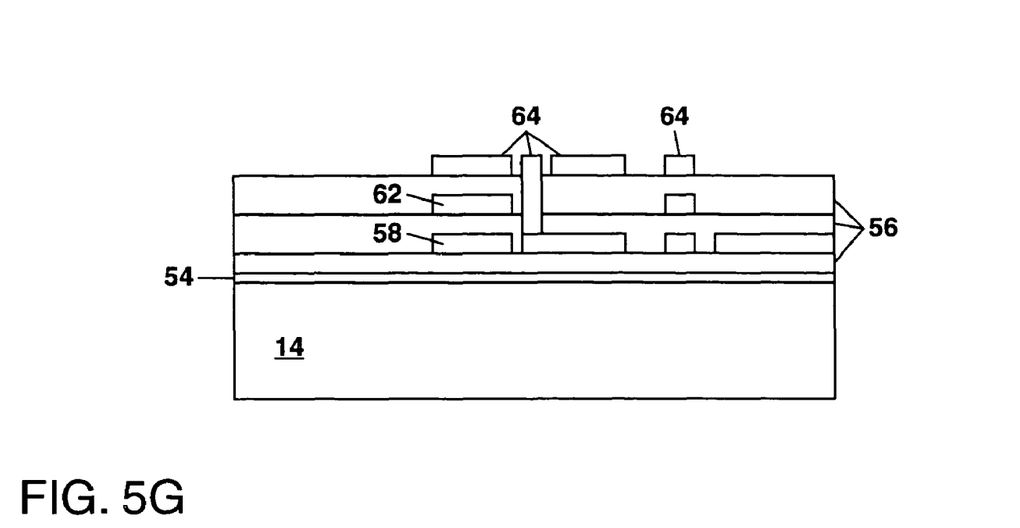

In FIG. 5G, a final polysilicon layer 64 (termed Poly-3) can be blanket deposited over the substrate 14 to a layer thickness of, for example, 2.25 µm and patterned. This completes the second set of teeth 18 and other elements of the active hinge apparatus 10.

Figure 5H:
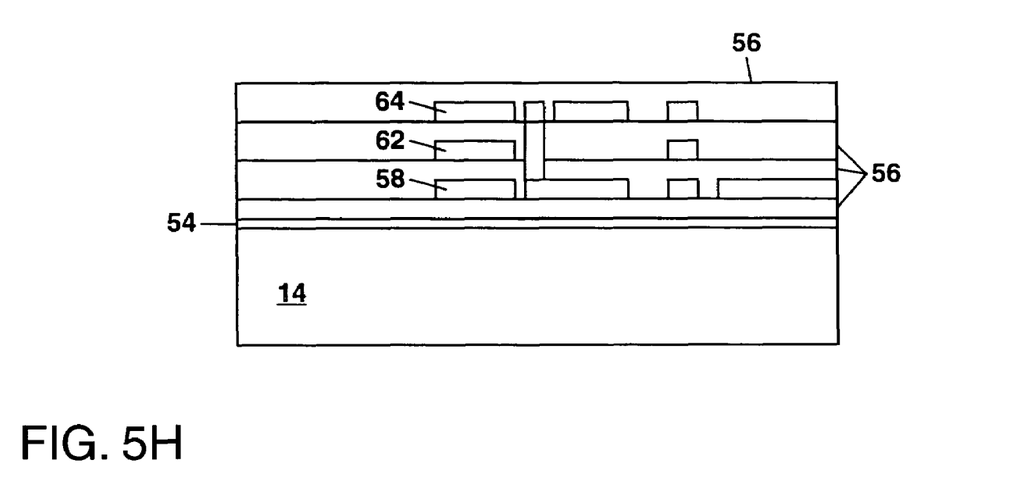

In FIG. 5H, a final layer of the sacrificial material 56 can be blanket deposited over the substrate 14 to encapsulate the Poly-3 layer in preparation for a final annealing step. This final layer of the sacrificial material 56 need not be planarized.

After the final annealing step, the various layers of the sacrificial material 56 can be removed using a selective wet etchant comprising hydrofluoric acid (HF) to complete the active hinge structure 10 with the micromechanical structure 12 attached as shown in FIGS. 1 and 2A. Immersion in the HF for a period of several hours or overnight dissolves away the sacrificial material but does not substantially chemically attack the substrate 14 and the various polysilicon layers 54, 58, 62 and 64.

Figure 6:
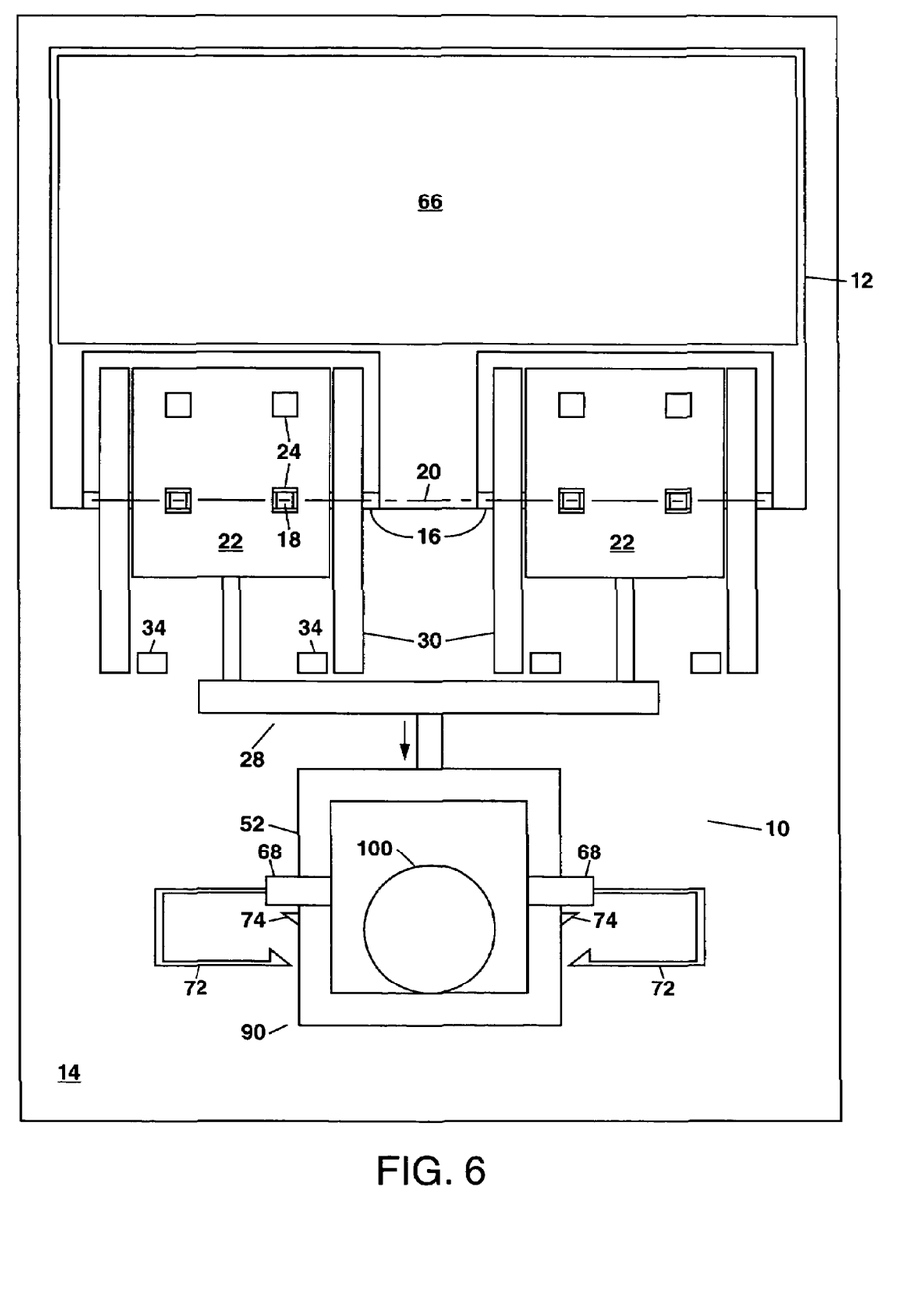
FIG. 6 shows a schematic plan view of a second example of the active hinge apparatus of the present invention.

FIG. 6 schematically illustrates in plan view a second example of the active hinge apparatus 10 of the present invention. In the example of FIG. 6, two active hinge devices 10 are coupled together to raise a single micromechanical structure 12 in the form of a plate or a micromirror. Those skilled in the art will understand that a micromirror can be formed from a plate 12 of polysilicon (e.g. the Poly-1 layer 58) as shown in FIG. 6 which has a nominal reflectivity for light of about 30%. To further increase the reflectivity, a mirror coating 66 comprising a layer of gold or aluminum or an aluminum alloy about 100-200 nanometers thick can be deposited over the surface of the plate 12. This can be done, for example, by evaporating or sputtering the mirror coating 66 onto the plate 12 through a shadow mask. If needed, a thin layer of titanium can be provided over the plate 12 prior to depositing the mirror coating 66 to improve the adhesion thereof.

In the example of FIG. 6, each active hinge device 10 can have a structure similar to that of FIGS. 1 and 2A, and can be formed as previously described with reference to FIGS. 5A-5H. A common linkage 28 can be used to connect the two active hinge devices 10 together so that they can be operated using a single actuator 26.

In the example of FIG. 6, the actuator 26 is a mechanically-powered actuator 90 which comprises a moveable frame 52 which can be moved in the direction shown by the arrow using an external micromanipulator probe tip 100. This moves the rack 22 and rotates the axle 16 to raise the micromechanical structure 12 as previously described.

The frame 52 can have an arbitrary shape which is sized to accept the micromanipulator probe tip 100, with the frame 52 being built up from one or more of the polysilicon layers (e.g. the Poly-1 and Poly-2 layers laminated together) at the same time the remainder of the active hinge apparatus 10 is formed. A pair of tabs 68 can also be formed from the polysilicon layers (e.g. the Poly-0 through Poly-3 layers) with the tabs 68 extending upward from the substrate 14 on either side of the frame 52 and bending over a portion of the frame 52 to allow the frame 52 to move back and forth to raise or lower the micromachined structure 12 while limiting movement in other directions (see FIG. 7).

One or more latches 72 can also be provided on the substrate 14 to engage with the frame 52 after the micromachined structure 12 has been raised to a predetermined point (e.g. substantially perpendicular to the substrate 14) and lock the micromachined structure 12 in place. In the example of FIG. 6, a pair of latches 72 are formed from one or more of the polysilicon layers (e.g. the Poly-1 layer) and attached at one end thereof to the tabs 68 (see FIG. 7). These latches 72 are fixed in place at one end thereof, with the frame 52 and a protrusion 74 being moveable to bypass the other end of each latch 72. Once this is done, the latch 72 prevents the frame 52 from moving back to an initial "as-fabricated" position, thereby preventing the micromachined structure 12 from being lowered. Operation of the latches 72 can be seen in FIGS. 7 and 8 which show a device similar to FIG. 6, but without a mirror coating 66, in the "as-fabricated" position and with the micromechanical structure 12 raised to an "erected" position, respectively.

Figure 7:
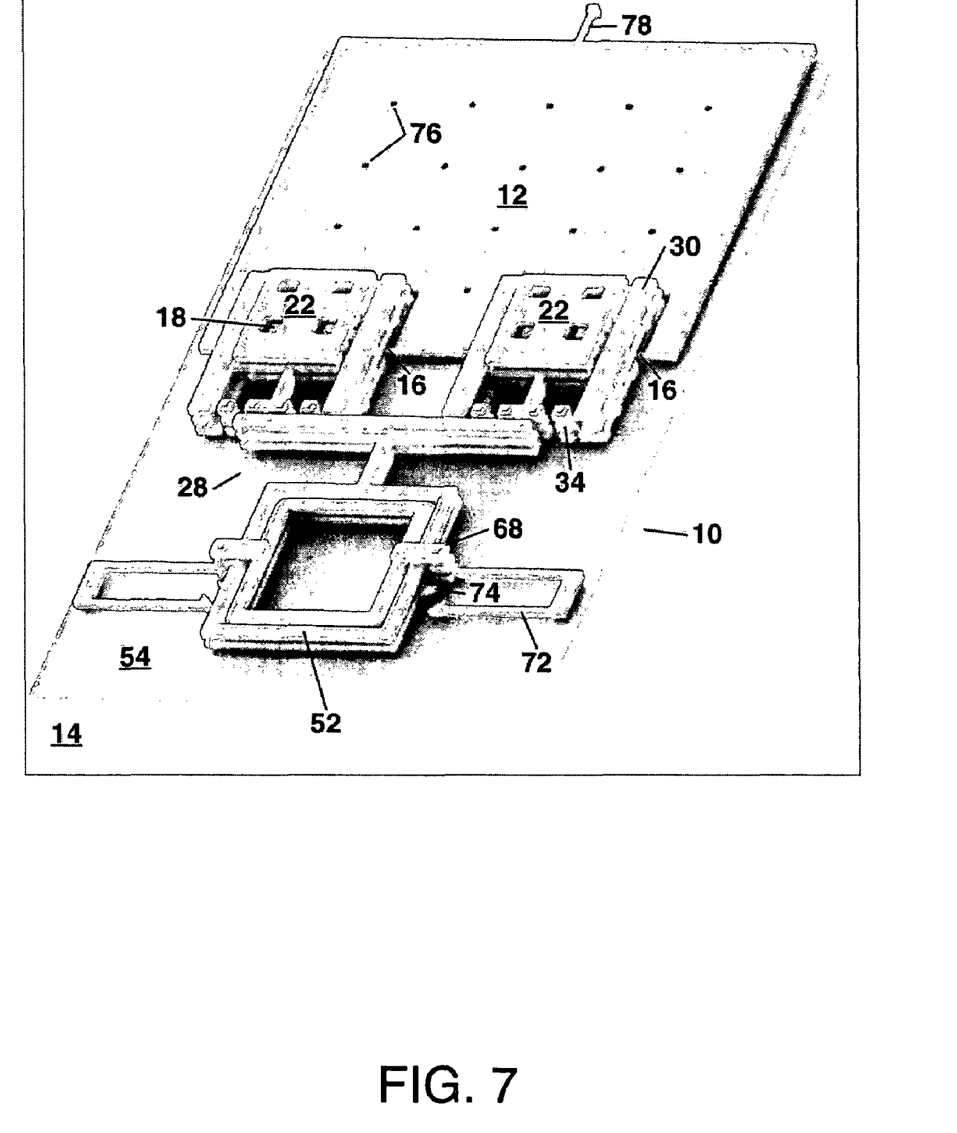
FIG. 7 shows an image of an active hinge apparatus according to FIG. 5 in an "as-fabricated" position.
Figure 8:
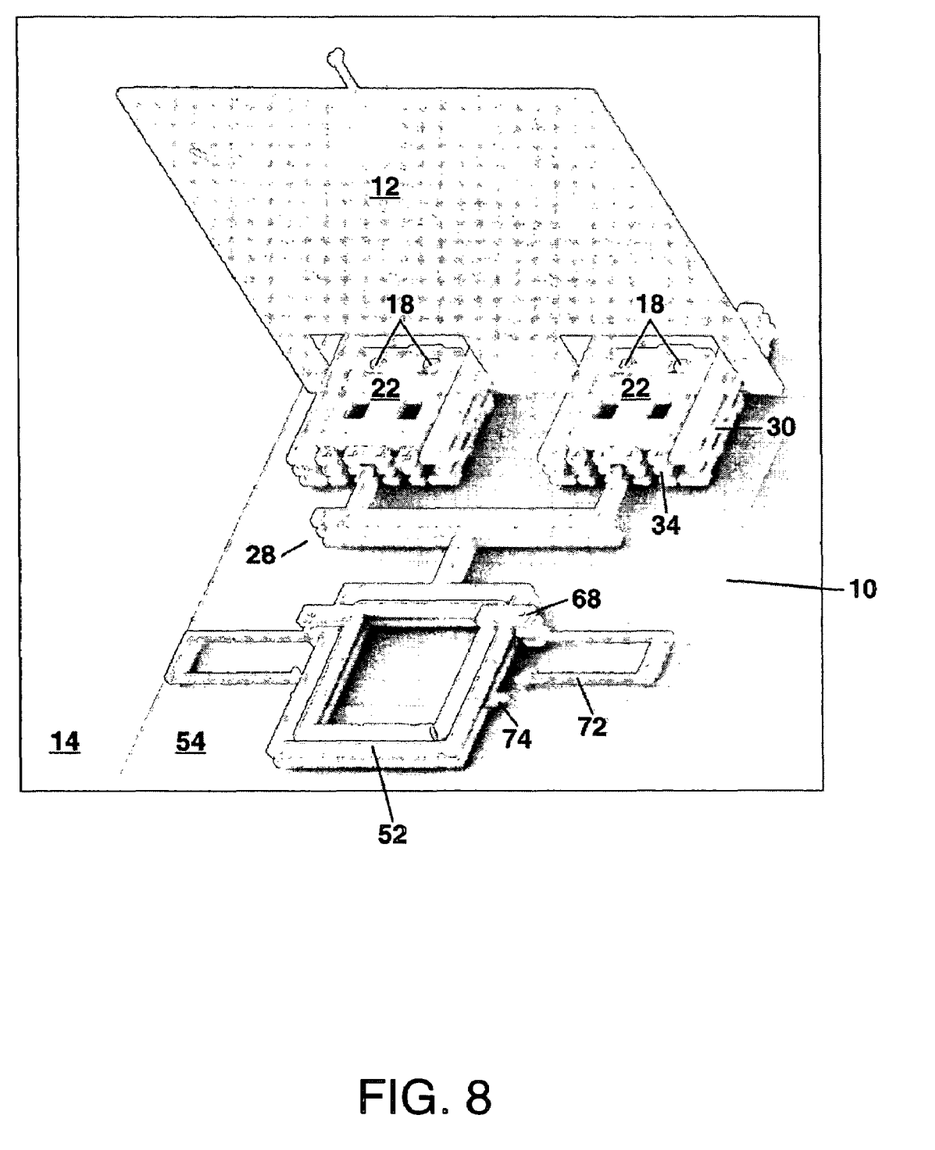
FIG. 8 shows an image of the device of FIG. 6 after using the active hinge apparatus to raise a micromechanical structure to an "erected" position substantially perpendicular to the substrate.

FIGS. 7 and 8 show additional details of an active hinge apparatus 10 similar to FIG. 6 including the various layers of polysilicon used to build up the elements of the active hinge apparatus 10. Also shown in FIGS. 7 and 8 are a plurality of micron-sized etch access holes 76 which can be provided through the micromachined structure 12 to facilitate removal of the sacrificial material 56 from beneath the micromachined structure 12 during the selective wet etching step previously described.

One or more ties 78 (also termed fuzes) can also be optionally provided to secure the micromachined structure 12 to the substrate 14 as shown in FIG. 7. Each tie 78, which can comprise the same polysilicon layers used to build the micromachined structure 12, is useful to secure the micromachined structure 12 during removal of the sacrificial material 56. This prevents any unwanted movement of the micromachined structure 12 during immersion in the selective wet etchant or during a drying step thereafter. To later release the micromachined structure 12, each tie 78 can be mechanically severed, or alternately electrically severed (e.g. as a fuze is blown by passing a alternating-current short pulse of a relatively large electrical current therethrough).

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An apparatus for raising a micromechanical structure from a first position substantially parallel to a substrate whereon the micromechanical structure is formed to a second position which is at an angle to the substrate, comprising:
   (a) an axle supported on the substrate and attached to one end of the micromechanical structure, with the axle having a pair of teeth protruding outward therefrom, with the teeth being oriented substantially perpendicular to each other and on an axis of rotation of the axle;
   (b) a rack above the axle to engage the pair of teeth and rotate the axle upon movement of the rack in a direction substantially parallel to the substrate, thereby raising the micromechanical structure from the first position to the second position; and
   (c) an actuator located on the substrate and operatively connected to move the rack in the direction substantially parallel to the substrate.

2. The apparatus of claim 1 wherein the substrate comprises silicon.

3. The apparatus of claim 1 wherein the axle and the pair of teeth comprise polycrystalline silicon.

4. The apparatus of claim 1 further comprising a pair of guides formed on opposite sides of the rack to guide the movement of the rack.

5. The apparatus of claim 1 wherein the second position is oriented at an angle substantially equal to 90 degrees with respect to the substrate.

6. The apparatus of claim 1 further comprising a latch to lock the micromechanical structure in the second position.

7. The apparatus of claim 1 wherein the micromechanical structure comprises a plate.

8. The apparatus of claim 1 wherein the micromechanical structure comprises a micromirror.

9. The apparatus of claim 1 wherein the actuator comprises a mechanically-powered actuator which includes a moveable frame which is sized to receive a probe tip, and which is operatively connected to the rack.

10. The apparatus of claim 1 wherein the actuator comprises an electrostatic comb actuator.

11. The apparatus of claim 1 wherein the actuator comprises a thermal actuator.

12. A micromechanical apparatus, comprising:
   (a) a substrate;
   (b) a plate supported on the substrate by an axle located at one end of the plate, with the axle having a first set of teeth which are substantially perpendicular to the plate, and with the axle having a second set of teeth which are substantially parallel to the plate; and
   (c) a rack located above the axle to engage at least one of the first and second sets of teeth and thereby rotate the axle and tilt the plate at an angle to the substrate when the rack is moved in a direction substantially parallel to the substrate.

13. The apparatus of claim 12 further comprising an actuator located on the substrate and operatively connected to move the rack.

14. The apparatus of claim 13 wherein the actuator comprises a mechanically-powered actuator having a moveable frame which is sized to receive a probe tip, with the moveable frame being operatively connected to the rack.

15. The apparatus of claim 13 wherein the actuator comprises an electrostatic comb actuator.

16. The apparatus of claim 13 wherein the actuator comprises a thermal actuator.

17. The apparatus of claim 13 further comprising a latch on the substrate to lock the plate in a tilted position with respect to the substrate.

18. The apparatus of claim 12 further comprising a pair of guides formed on opposite sides of the rack to guide the movement of the rack.

19. The apparatus of claim 12 wherein the plate comprises a mirror coating.

20. The apparatus of claim 12 wherein the substrate comprises silicon.

21. The apparatus of claim 12 wherein the plate comprises polycrystalline silicon.

* * * * *